United States Patent
Laneryd et al.

(10) Patent No.: US 11,366,025 B2
(45) Date of Patent: Jun. 21, 2022

(54) HIGH VOLTAGE SYSTEM COMPRISING A TEMPERATURE DISTRIBUTION DETERMINING DEVICE

(71) Applicant: HITACHI ENERGY SWITZERLAND AG, Baden (CH)

(72) Inventors: Tor Laneryd, Enköping (SE); Joachim Schiessling, Enköping (SE)

(73) Assignee: HITACHI ENERGY SWITZERLAND AG, Baden (CH)

( * ) Notice: Subject to any disclaimer, the term of this patent is extended or adjusted under 35 U.S.C. 154(b) by 0 days.

(21) Appl. No.: 17/434,735

(22) PCT Filed: Feb. 28, 2020

(86) PCT No.: PCT/EP2020/055362
§ 371 (c)(1),
(2) Date: Aug. 28, 2021

(87) PCT Pub. No.: WO2020/178202
PCT Pub. Date: Sep. 10, 2020

(65) Prior Publication Data
US 2022/0042858 A1   Feb. 10, 2022

(30) Foreign Application Priority Data
Mar. 1, 2019   (EP) .................... 19160313

(51) Int. Cl.
*G01K 7/42* (2006.01)
*H01B 17/26* (2006.01)
(Continued)

(52) U.S. Cl.
CPC ............. *G01K 7/427* (2013.01); *G01F 23/26* (2013.01); *H01B 17/26* (2013.01); *G01R 31/1245* (2013.01)

(58) Field of Classification Search
CPC ........ G01K 7/427; G01F 23/26; H01B 17/26; G01R 31/1245
See application file for complete search history.

(56) References Cited

U.S. PATENT DOCUMENTS 2,859,724 A * 11/1958 Cronin .................... G01F 23/34
                                                            73/317
4,123,618 A * 10/1978 Cushing ................. H01H 33/68
                                                            174/209

(Continued)

FOREIGN PATENT DOCUMENTS

CN          202501904 U     10/2012
CN          104880235 A      9/2015
(Continued)

OTHER PUBLICATIONS

Youssaf et al. "Steady State Temperature distribution of high voltage bushings—analysis and measurements" (Feb. 1988); IEEE transaction on Power Systems, V.3. No. 1; pp. 278-285 (Year: 1988).*

(Continued)

*Primary Examiner* — Nathaniel T Woodward
*Assistant Examiner* — Philip L Cotey
(74) *Attorney, Agent, or Firm* — Sage Patent Group

(57) ABSTRACT

A high voltage system including: a high voltage bushing having a bushing body configured to be assembled with a tank filled with a dielectric liquid wherein the bushing body has a cavity, and the bushing includes a dielectric liquid level sensor configured to measure a dielectric liquid level in the cavity, and a temperature distribution determining device configured to determine a heat distribution in the bushing based on the dielectric liquid level measured by the dielectric liquid level sensor.

19 Claims, 2 Drawing Sheets

(51) Int. Cl.
    *G01F 23/26*     (2022.01)
    *G01R 31/12*     (2020.01)

(56) References Cited

U.S. PATENT DOCUMENTS

| | | | | |
|---|---|---|---|---|
| 8,400,320 | B2* | 3/2013 | Santos | G01F 23/18 |
| | | | | 340/622 |
| 9,893,501 | B2* | 2/2018 | Vojtila | H02G 1/02 |
| 2011/0156918 | A1* | 6/2011 | Santos | G01F 23/185 |
| | | | | 340/622 |
| 2011/0301880 | A1* | 12/2011 | Stenestam | G01R 31/62 |
| | | | | 702/50 |
| 2017/0274419 | A1* | 9/2017 | Frimpong | C09D 7/61 |
| 2019/0027292 | A1* | 1/2019 | Findeisen | H01F 27/12 |
| 2020/0393521 | A1* | 12/2020 | Bayoumi | H01F 27/402 |

FOREIGN PATENT DOCUMENTS

| | | |
|---|---|---|
| CN | 107123246 A | 9/2017 |
| EP | 3435049 A1 | 1/2019 |
| JP | S60-27818 A | 2/1985 |
| JP | S63-63923 A | 3/1988 |
| JP | H04-296409 A | 10/1992 |
| JP | 2008-039683 A | 2/2008 |

OTHER PUBLICATIONS

International Search Report and Written Opinion of the International Searching Authority, PCT/EP2020/055362, dated May 25, 2020, 14 pages.
International Preliminary Report on Patentability, PCT/EP2020/055362, dated Jul. 6, 2021, 9 pages.
First Office Action, Chinese Patent Application No. 202080017953.2, dated Dec. 22, 2021, 6 pages.
First Examination Report, Indian Patent Application No. 202147039342, dated Mar. 9, 2022, 7 pages.

\* cited by examiner

HIGH VOLTAGE SYSTEM COMPRISING A TEMPERATURE DISTRIBUTION DETERMINING DEVICE

CROSS REFERENCE TO RELATED APPLICATIONS

This application is a 35 U.S.C. § 371 national stage application of PCT International Application No. PCT/EP2020/055362 filed on Feb. 28, 2020, which in turn claims foreign priority to European Patent Application No. 19160313.3, filed on Mar. 1, 2019, the disclosures and content of which are incorporated by reference herein in their entirety.

TECHNICAL FIELD

The present disclosure generally relates to high voltage systems. In particular, it relates to high voltage systems comprising a high voltage bushing.

BACKGROUND

High voltage bushings are sensitive to the operating temperature. A temperature sensor can supply a partial understanding but only in the close vicinity of the sensor which may not be representative of the bushing as a whole. There are also practical issues involved in installing a temperature sensor close to the most critical areas where the information of temperature levels would be of most interest. The sensor itself may create an additional point of failure of the bushing and thereby counteract its purpose. The difficulties are even more severe if a multitude of temperature sensors are to be installed.

Various publications such as JP2008039683A and JPS6363923A disclose oil-filled bushings provided with means for detecting the oil level in the bushing.

The bushing oil level is considered critical for the continued short-term operation of oil-filled bushings where the oil is circulating inside the bushing. A reduced oil level may then prevent oil circulation and quickly cause overheating. The oil may also be required for electrical withstand strength.

For dry bushings the oil level is not critical for the continued short-term operation of the bushing. The oil is not considered to be part of the bushing, but since the bushing is connected to the transformer tank and in fluid communication with the oil in the tank, it will be at least partially filled with oil.

SUMMARY

A clear understanding of the condition of a bushing requires detailed knowledge of the temperature distribution within the bushing. For example, the voltage at the measurement tap of resin impregnated bushings can be used to detect partial breakdown between foils and predict imminent breakdown, but the accuracy depends on knowledge of the temperature distribution.

In view of the above, an object of the present disclosure is to provide a high voltage system which solves, or at least mitigates, the problems of the prior art.

There is hence according to a first aspect of the present disclosure provided a high voltage system comprising: a high voltage bushing having a bushing body configured to be assembled with a tank filled with a dielectric liquid, wherein the bushing body has a cavity, and the bushing comprises a dielectric liquid level sensor configured to measure a dielectric liquid level in the cavity, and a temperature distribution determining device configured to determine a heat distribution in the bushing based on the dielectric liquid level measured by the dielectric liquid level sensor.

Due to the estimated temperature distribution in the bushing, improved condition monitoring of the bushing may be obtained.

Additionally, since an estimation of the temperature distribution in the bushing may be obtained at a given time, e.g. in real-time, the rating of the bushing may be seen as dynamic instead of the traditional static view. This is because the amount of current that is allowed to pass through the bushing is dependent of the temperature in the bushing. For example, if at a certain time the estimated temperature distribution reflects a relatively low temperature in the bushing, it may at this time be possible to pass more current through the bushing than its traditional rating would allow. The grid operator may thereby be able to use the estimated temperature distribution in the bushing to its advantage when operating the grid.

The dielectric liquid level sensor may for example be one of an ultrasonic sensor, a capacitance sensor, a floating device whose position can be determined relative to a receiver mounted at e.g. the top or the bottom of the bushing, a fibre optic sensor, or an isostatic pressure sensor.

According to one embodiment the bushing body has a tank end portion provided with an opening into the cavity. The bushing is hence in liquid communication with the interior of the tank. Dielectric liquid from the tank may hence flow into the bushing.

According to one embodiment the temperature distribution determining device is configured to receive a current value of current passing through the bushing, wherein the temperature distribution determining device is configured to determine the temperature distribution further based on the current value.

According to one embodiment the temperature distribution determining device is configured to obtain an ambient air temperature of ambient air surrounding the bushing, wherein the temperature distribution determining device is configured to determine the temperature distribution further based on the ambient air temperature.

According to one embodiment the temperature distribution determining device is configured to obtain a dielectric liquid temperature of the dielectric liquid in the tank, wherein the temperature distribution determining device is configured to determine the temperature distribution further based on the dielectric liquid temperature.

According to one embodiment the temperature distribution determining device comprises a mathematical model of the bushing, wherein the temperature distribution determining device is configured to utilise the mathematical model to determine the temperature distribution in the bushing.

According to one embodiment the mathematical model is based on the geometry of the bushing and takes weather conditions into account.

The geometry of the bushing may for example include the bushing length, bushing diameter, and/or the mounting angle, e.g. the angle of the central axis of the bushing relative to the horizontal or vertical plane.

Weather conditions may for example include one or more of ambient air temperature, wind speed, and precipitation.

The mathematical model may take the conductor type of the bushing into account.

The mathematical model may according to one example be configured to receive input data in the form of the dielectric liquid temperature in the tank and/or the current flowing through the bushing, in particular the conductor of the bushing.

According to one embodiment the mathematical model is further based on that the bushing comprises resin-impregnated material.

According to one embodiment the bushing is a dry-type bushing.

According to one embodiment the bushing is a resin-impregnated bushing. The bushing may for example be a resin-impregnated paper bushing or a resin-impregnated synthetic bushing.

There is according to a second aspect of the present disclosure provided a high voltage electromagnetic induction system comprising: a high voltage system according to the first aspect, and an electromagnetic induction device comprising a tank filled with a dielectric liquid, wherein the bushing is assembled with the tank.

The electromagnetic induction device may for example be a transformer or a reactor.

The dielectric liquid in the tank may for example be mineral oil, a synthetic ester, a natural ester or an isoparaffinic liquid.

There is according to a third aspect of the present disclosure provided a method of determining a temperature distribution in a high voltage bushing assembled with a tank filled with a dielectric liquid, wherein the bushing has a bushing body having a cavity, and the bushing comprises a dielectric liquid level sensor configured to measure a dielectric liquid level in the cavity, wherein the method comprises: a) obtaining a dielectric liquid level in the cavity measured by the dielectric liquid level sensor, and b) determining a temperature distribution in the bushing based on the dielectric liquid level.

One embodiment comprises obtaining a current value of current passing through the bushing, wherein step b) is further based on the current value.

One embodiment comprises obtaining an ambient air temperature of ambient air surrounding the bushing, wherein step b) is further based on the ambient air temperature.

One embodiment comprises obtaining a dielectric liquid temperature of the dielectric liquid in the tank, wherein step b) is further based on the dielectric liquid temperature.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1:
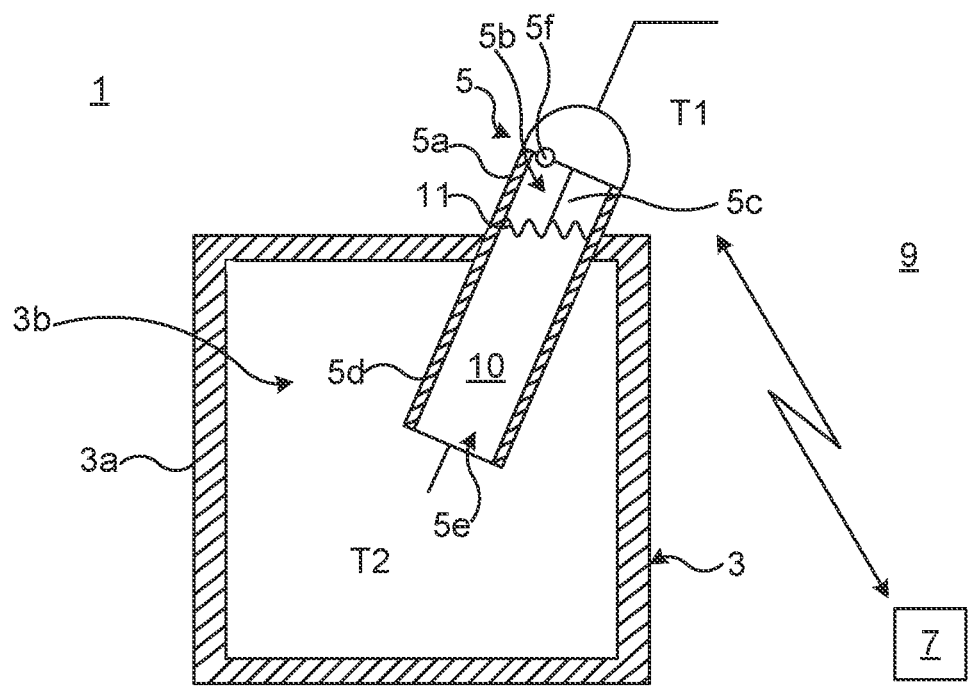
FIG. 1 schematically shows a sectional view of an example of a high voltage electromagnetic induction system.

FIG. 1 depicts an example of a high voltage electromagnetic induction system 1. The exemplified high voltage electromagnetic induction system 1 comprises an electromagnetic induction device 3, a high voltage bushing 5, and a temperature distribution determining device 7. The high voltage bushing 5 and the temperature distribution determining device 7 form a high voltage system 9.

The electromagnetic induction device 3 is a high voltage electromagnetic induction device 3. The electromagnetic induction device 3 may for example be a transformer or a reactor. The electromagnetic induction device 3 has a tank 3a. The electromagnetic induction device 3 may furthermore comprise electromagnetic components, such as a magnetic core, yokes holding the magnetic core, one or more windings wound around one or more limbs of the magnetic core, and solid electrical insulation (not shown). The electromagnetic induction device 3 comprises a dielectric liquid 3b. The tank 3a is typically filled with the dielectric liquid 3b.

The high voltage bushing 5 is beneficially a dry-type bushing, such as a resin impregnated paper or synthetic bushing. The high voltage bushing 5 is configured to be installed in the tank 3a. The high voltage bushing 5 may for example have a flange by which it may be mounted to the tank 3a. The tank 3a has a tank opening configured to receive a portion of the high voltage bushing 5.

The high voltage bushing 5 has a bushing body 5a. The bushing body 5a may for example be provided with the aforementioned flanges. The bushing body 5a has a cavity or interior space 5b. The bushing body 5a is typically elongated such as generally cylindrical. The high voltage bushing 5 furthermore has a conductor 5c extending through the bushing body 5a. The cavity 5b may be formed around the conductor 5c. In some examples the conductor 5c may be hollow, and the cavity 5b may extend inside the hollow conductor 5c.

The bushing body 5a has a tank end portion 5d configured to be received by the tank 3a. According to the exemplified high voltage bushing 5, the tank end portion 5d is provided with an opening 5e. The conductor 5c may extend through the opening se into the tank 3a. The opening se opens into the cavity 5b. Hereto, the cavity 5b is in fluid communication with the interior of the tank 3a when the high voltage bushing 5 is installed in the tank 3a. The dielectric liquid 3b in the tank 3a flows into the cavity 5b of the bushing body 5a when the high voltage bushing 5 is installed in the tank 3a. There will hence typically at any time be a dielectric liquid level 11 in the cavity 5b due to dielectric liquid 3b having flown from the tank 3 into the bushing body 5a via the opening 5e.

The high voltage bushing 5 comprises a dielectric liquid level sensor 5f. The dielectric liquid level sensor 5f is configured to measure the dielectric liquid level 11 in the cavity 5b. Any suitable dielectric liquid level sensor may be used for this purpose.

The temperature distribution determining device 7 is configured to receive dielectric liquid level measurements from the dielectric liquid level sensor 5f. The temperature distribution determining device 7 is configured to determine a temperature distribution in the high voltage bushing 5 based on the dielectric liquid level measurements. This determination is an estimation of the temperature distribution in the high voltage bushing 5. The temperature distribution may for example be along the axial direction of the high voltage bushing 5 and/or along the radial directions of the high voltage bushing 5.

In the example depicted in FIG. 1, the temperature distribution determining device 7 is arranged remote from the high voltage bushing 5 and the electromagnetic induction device 3, but could alternatively be installed on the high voltage bushing 5, or on the electromagnetic induction device 3. In the present example, the temperature distribution determining device 7 is configured to wirelessly communicate with the high voltage bushing 5, e.g. the dielectric liquid level sensor 5*f*, but could alternatively or additionally be arranged with a wired connection with the high voltage bushing 5.

Figure 2:
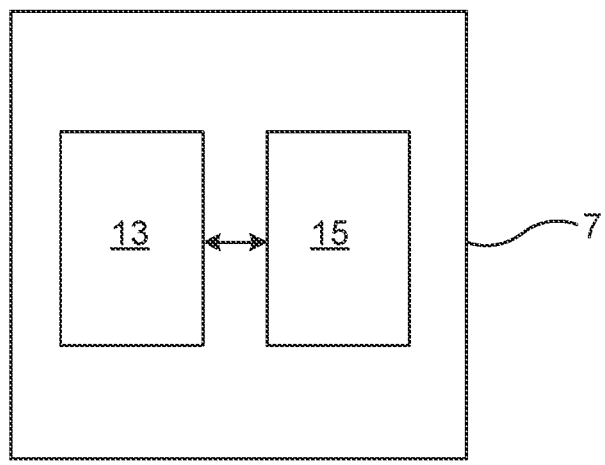
FIG. 2 is a schematic block diagram of a temperature distribution determining device.

FIG. 2 schematically shows a block diagram of an example of the temperature distribution determining device 7. The temperature distribution determining device 7 may comprise processing circuitry 13 and a storage medium 15.

The processing circuitry 13 may for example use any combination of one or more of a suitable central processing unit (CPU), multiprocessor, microcontroller, digital signal processor (DSP), application specific integrated circuit (ASIC), field programmable gate arrays (FPGA) etc., capable of executing any herein disclosed operations concerning temperature distribution determination in the high voltage bushing 5.

The storage medium 15 may for example be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory.

The temperature distribution determining device 7 may according to one example be implemented as a cloud solution. Hereto, the herein disclosed operations concerning temperature distribution determining in the high voltage bushing 5 may according to one variation be partly or wholly performed in a cloud.

The temperature distribution determining device 7 may be configured to receive a current value of the current flowing through the conductor 5*c* of the high voltage bushing 5. The temperature distribution determining device 7 may in this case be configured to determine the temperature distribution in the high voltage bushing 5 further based on the current value. The current value may for example be obtained from a sensor, such as a current transformer, or it may be estimated.

The temperature distribution determining device 7 may be configured to obtain an ambient air temperature T1 of ambient air surrounding the high voltage bushing 5. The temperature distribution determining device 7 may in this case be configured to determine the temperature distribution in the high voltage bushing 5 further based on the ambient air temperature T1. The ambient air temperature T1 may for example be obtained from a local temperature sensor, from a weather station or from weather forecasting.

The temperature distribution determining device 7 may furthermore be configured to obtain further weather condition data such as current precipitation and wind speed. The precipitation and wind speed may for example be obtained from local sensors, from a weather station or from weather forecasting. The temperature distribution determining device 7 may be configured to determine the temperature distribution in the high voltage bushing 5 further based on the weather condition data such as the wind speed and/or the precipitation.

The temperature distribution determining device 7 may be configured to obtain a dielectric liquid temperature T2 of the dielectric liquid 3*b* in the tank 3*a*. The temperature distribution determining device 7 may in this case be configured to determine the temperature distribution in the high voltage bushing 5 further based on the dielectric liquid temperature T2.

The measurement of the dielectric liquid temperature T2 may preferably be performed at a vertical position corresponding to the point where fluid communication occurs between the high voltage bushing 5 and the tank 3*a*, for example at least 10 mm away from any loss generating components.

The temperature distribution determining device 7 may include a mathematical model of the high voltage bushing 5. In particular, the storage medium 15 may contain the mathematical model, included in a computer program executable by the processing circuitry 13. The mathematical model of the high voltage bushing may for example be based on the geometry of the bushing and/or the type of the bushing, e.g. dry-type resin impregnated bushing, in particular a resin impregnated paper/synthetic bushing. The mathematical model may be designed to use any of the aforementioned data, e.g. current value, ambient air temperature T1, weather conditions, and dielectric liquid temperature T2 as input data for determining the temperature distribution in the high voltage bushing 5.

A Finite Element Method (FEM) or similar method may be used for determining the temperature distribution in the high voltage bushing 5 by finding the solution(s) of the mathematical model using inputs such as the current value/current through the conductor 5*c*, ambient air temperature T1 and/or the air temperature inside the cavity in the high voltage bushing, the measured dielectric liquid level, and the dielectric liquid temperature T2, together with boundary conditions.

Figure 3:
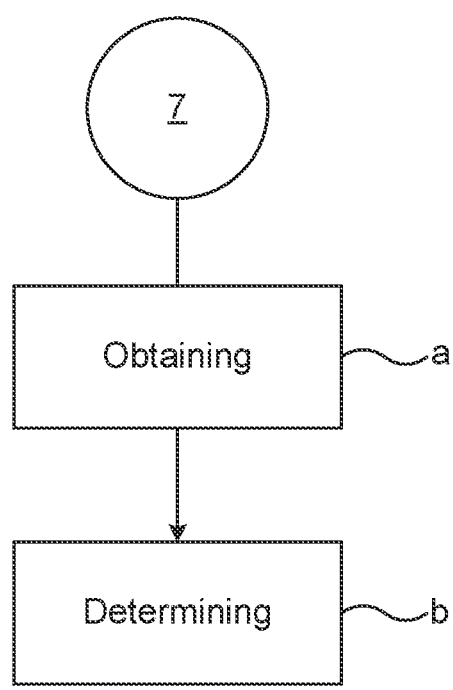
FIG. 3 is a flowchart of a method of determining a temperature distribution in a high voltage bushing.

FIG. 3 is a flowchart of a method of determining the temperature distribution in the high voltage bushing 5 by means of the temperature distribution determining device 7.

In a step a) the dielectric liquid level 11 measured by the dielectric liquid level sensor 5*f* is obtained from the dielectric liquid level sensor 5*f*.

Additional data, such as any of the weather condition data, the current value of the current through the conductor 5*c*, the ambient air temperature T1, and the dielectric liquid temperature T2 may also be obtained in step a), although not necessarily simultaneously.

In a step b) the temperature distribution in the high voltage bushing 5 is determined based on the dielectric liquid level 11 measured by the dielectric liquid level sensor 5*f*.

In case any of the aforementioned additional data is obtained in step a), such data may also be used to determine the temperature distribution. The specific additional parameters, i.e. all or some of the additional data, used in different embodiments in general depend on the implementation of the mathematical model and the desired accuracy in the estimated temperature distribution in the high voltage bushing 5. Using the dielectric liquid level, the ambient air temperature T1, the dielectric liquid temperature T2 in the tank 3a, the current value of the current flowing through the bushing, as well as wind speed and precipitation provides the most accurate estimation.

According to one example the high voltage bushing 5 may include one or more temperature sensors. The temperature distribution determining device 7 may use these temperature measurements to tune parameters, such as heat transfer coefficients to air, of the mathematical model. This tuning may for example be performed during a limited period of time. After the tuning period the temperature measurements may be used to identify early warnings of bushing failure, e.g. if the measured temperature is higher than the corresponding mathematical model temperature, it indicates an increase in losses that may precede a breakdown. The temperature sensor(s) may be designed with a shorter expected lifetime than the bushing itself, so that even if the sensor stops working after the tuning period, continued reliable operation of the bushing is still possible.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A high voltage system comprising:
a high voltage bushing having a bushing body configured to be assembled with a tank filled with a dielectric liquid wherein the bushing body has a cavity, and the bushing comprises a dielectric liquid level sensor configured to measure a dielectric liquid level in the cavity, and
a temperature distribution determining device configured to determine a heat distribution in the bushing based on the dielectric liquid level measured by the dielectric liquid level sensor,
wherein the bushing body has a tank end portion provided with an opening into the cavity.

2. The high voltage system of claim 1, wherein the temperature distribution determining device is configured to receive a current value of current passing through the bushing, wherein the temperature distribution determining device is configured to determine the temperature distribution further based on the current value.

3. The high voltage system of claim 1, wherein the temperature distribution determining device is configured to obtain an ambient air temperature of ambient air surrounding the bushing, wherein the temperature distribution determining device is configured to determine the temperature distribution further based on the ambient air temperature.

4. The high voltage system of claim 1, wherein the temperature distribution determining device is configured to obtain a dielectric liquid temperature of the dielectric liquid in the tank, wherein the temperature distribution determining device is configured to determine the temperature distribution further based on the dielectric liquid temperature.

5. The high voltage system of claim 1, wherein the temperature distribution determining device comprises a mathematical model of the bushing, wherein the temperature distribution determining device is configured to utilize the mathematical model to determine the temperature distribution in the bushing.

6. The high voltage system of claim 5, wherein the mathematical model is based on the geometry of the bushing and takes weather conditions into account.

7. The high voltage system of claim 6, wherein the mathematical model is further based on that the bushing comprises resin-impregnated material.

8. The high voltage system of claim 1, wherein the bushing is a dry-type bushing.

9. The high voltage system of claim 1, wherein the bushing is a resin-impregnated bushing.

10. A high voltage electromagnetic induction system comprising:
a high voltage system of claim 1, and
an electromagnetic induction device comprising a tank filled with a dielectric liquid, wherein the bushing is assembled with the tank.

11. The high voltage electromagnetic induction system of claim 10, wherein the bushing comprises a dry-type bushing or a resin-impregnated bushing.

12. A method of determining a temperature distribution in a high voltage bushing assembled with a tank filled with a dielectric liquid, wherein the bushing has a bushing body having a cavity, and the bushing comprises a dielectric liquid level sensor configured to measure a dielectric liquid level in the cavity, wherein the method comprises:
a) obtaining a dielectric liquid level in the cavity measured by the dielectric liquid level sensor, and
b) determining a temperature distribution in the bushing based on the dielectric liquid level,
wherein the bushing is a dry-type bushing.

13. The method of claim 12, comprising obtaining a current value of current passing through the bushing, wherein step b) is further based on the current value.

14. The method of claim 12, comprising obtaining an ambient air temperature of ambient air surrounding the bushing, wherein step b) is further based on the ambient air temperature.

15. The method of claim 12, comprising obtaining a dielectric liquid temperature of the dielectric liquid in the tank, wherein step b) is further based on the dielectric liquid temperature.

16. A method of determining a temperature distribution in a high voltage bushing assembled with a tank filled with a dielectric liquid, wherein the bushing has a bushing body having a cavity, and the bushing comprises a dielectric liquid level sensor configured to measure a dielectric liquid level in the cavity, wherein the method comprises:
a) obtaining a dielectric liquid level in the cavity measured by the dielectric liquid level sensor, and
b) determining a temperature distribution in the bushing based on the dielectric liquid level,
wherein the bushing is a resin-impregnated bushing.

17. The method of claim 16, comprising obtaining a current value of current passing through the bushing, wherein step b) is further based on the current value.

18. The method of claim 16, comprising obtaining an ambient air temperature of ambient air surrounding the bushing, wherein step b) is further based on the ambient air temperature.

19. The method of claim 16, comprising obtaining a dielectric liquid temperature of the dielectric liquid in the tank, wherein step b) is further based on the dielectric liquid temperature.

* * * * *